(12) United States Patent
Painchaud et al.

(10) Patent No.: US 8,145,066 B2
(45) Date of Patent: Mar. 27, 2012

(54) PREDISTORTION USING FPGA

(75) Inventors: Dean Painchaud, Cromwell, CT (US); Zhijian Sun, Avon, CT (US); Marcel F. Schemmann, Maria Hoop (NL)

(73) Assignee: ARRIS Group, Inc., Suwanee, GA (US)

(*) Notice: Subject to any disclaimer, the term of this patent is extended or adjusted under 35 U.S.C. 154(b) by 431 days.

(21) Appl. No.: 12/406,094

(22) Filed: Mar. 17, 2009

(65) Prior Publication Data

US 2009/0237767 A1    Sep. 24, 2009

Related U.S. Application Data

(60) Provisional application No. 61/069,790, filed on Mar. 17, 2008.

(51) Int. Cl.
*H04B 10/04* (2006.01)

(52) U.S. Cl. ......... 398/193; 398/192; 398/195; 398/194

(58) Field of Classification Search ........... 398/193, 398/192, 195, 194
See application file for complete search history.

(56) References Cited

U.S. PATENT DOCUMENTS

| | | | | |
|---|---|---|---|---|
| 5,161,044 A | * | 11/1992 | Nazarathy et al. | 398/194 |
| 6,583,906 B1 | * | 6/2003 | Schemmann et al. | 398/158 |
| 7,382,984 B2 | * | 6/2008 | McNicol et al. | 398/147 |
| 2008/0130785 A1 | * | 6/2008 | Reinhardt | 375/296 |
| 2008/0272943 A1 | * | 11/2008 | Tanimura et al. | 341/131 |

* cited by examiner

*Primary Examiner* — Kinam Park
(74) *Attorney, Agent, or Firm* — Troy A. Van Aacken; Robert J. Starr

(57) ABSTRACT

Predistortion logic for an optical communications laser or optical modulator, includes predistortion logic embodied in a field programmable gate array (FPGA). A first analog to digital converter (ADC) provides a representation of an RF signal at an input of the FPGA. A digital to analog converter provides a representation of an output of the FPGA to a laser or modulator.

18 Claims, 5 Drawing Sheets

PREDISTORTION USING FPGA

PRIORITY CLAIM

The present application claims priority under 35 USC 119 to U.S. application No. 61/069,790 filed on Monday, Mar. 17, 2008, which is presently pending, and which is incorporated herein by reference.

BACKGROUND

In cable television signal distribution systems, many separate radio frequency (RF) television channels are simultaneously transmitted over a transmission line, and a required bandwidth thereof may extend from as low as about 40 MHz to as high as about 1 GHz. Presently, cable television distribution systems conventionally employ coaxial cable as the transmission line for the RF spectra. Due to the significant signal losses inherent with coaxial cable transmission lines, repeater amplifiers must usually be provided at closely spaced distances, such as at every half mile along the extent of the network. These repeaters are expensive, require a constant power supply, introduce cumulative distortion, and must be maintained in order to provide continuous cable service to subscribers.

Optical communications lasers, such as laser diodes and distributed feedback ("DFB") lasers, exhibit significant amounts of intermodulation distortion, particularly composite second order (CSO) distortion products, i.e. distortion products of the type $2f_1$, $2f_2$, $f_2-f_1$, and $f_2+f_1$. Predistortion techniques have been proposed as one method for improving distortion levels at the laser output.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Figure 1:
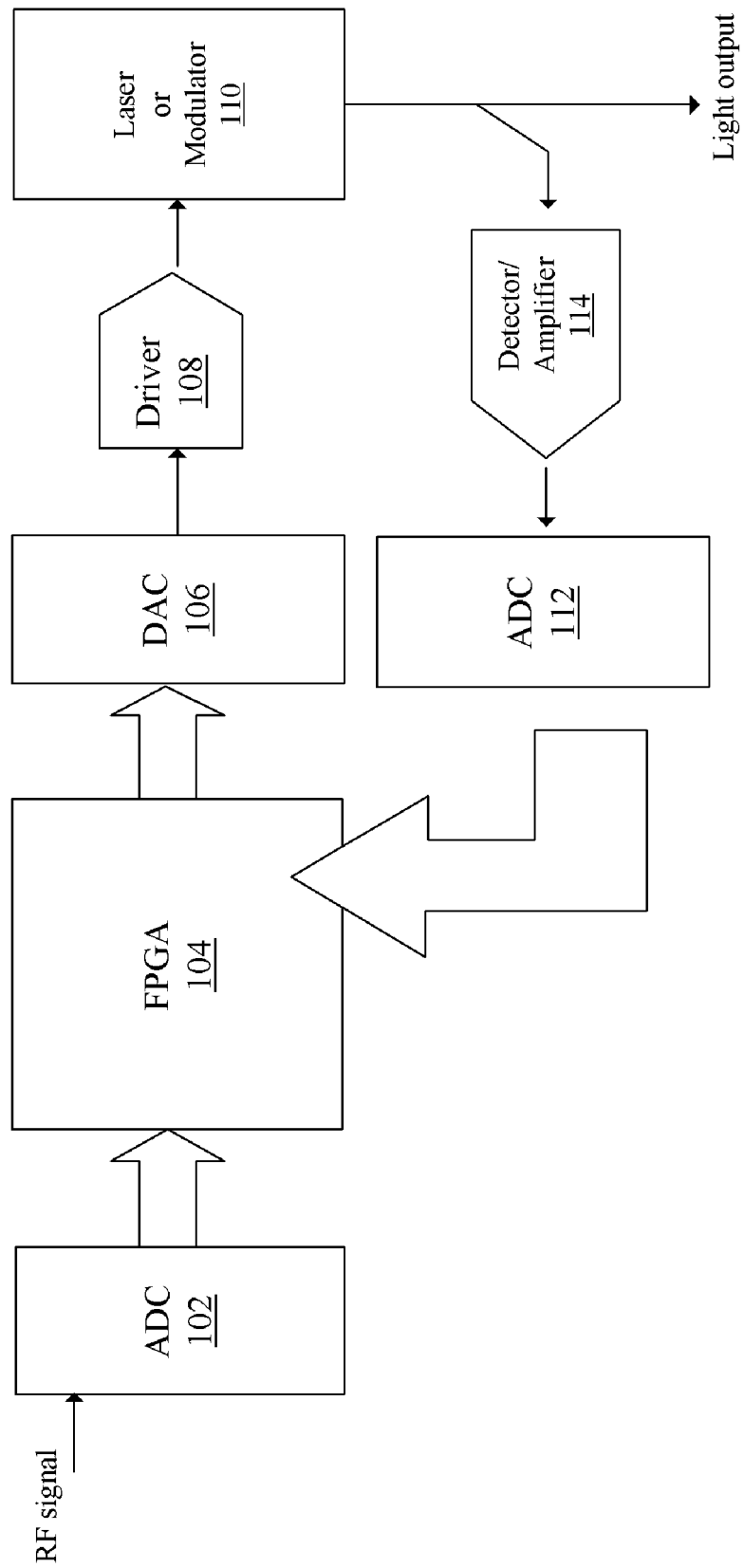
FIG. 1 is an illustration of an embodiment of an FPGA-based optical transmitter with linearization.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Described herein are embodiments of logic and techniques to digitally compute predistortion signals in field programmable gate arrays (FPGAs) and forward these to radio frequency (RF) components using digital-analog (DA) converters. The techniques employ fast FPGAs, analog-digital converters (ADCs), and digital-analog converters (DACs) technology. Applications include predistortion circuits than only generate predistortion signals, and circuits that generate both the main RF signal and predistortion signals. The input to the overall circuit can be RF or digital. In case the input is RF, an AD converter may be used in front of the FPGA to digitize the RF signal spectrum that needs to be pre-distorted. Optionally an additional AD converter can be used to digitize the overall system output (or a derivative thereof) to monitor the overall predistortion effectiveness.

The difference between a system that processes only pre-distortion signals and a system that processes the main signal as well is significant because in most cases pre-distorter signals are significantly smaller than main RF signals. Requirements of AD and DA converters and on internal computation bit-width are usually significantly relaxed in systems that only generate pre-distortion signals and have another path for the main RF signals.

Predistortion logic and techniques are described herein may be applied to any type of RF signal generation, such as QAM generation, filtering and amplification. The FPGA and DA converter may provide both RF signal and predistortion signal components. Measurement and feedback of the system output is possible but not always required, depending on the amount of distortion compensation needed.

In other cases, such as RF amplifiers or fiber-optic transmitters, the FPGA and DA converter may preferably process predistortion signals. An AD converter may be added to digitize the RF signal at the FPGA input. In such systems many types of distortion can be addressed such as laser distortion, modulator distortion, fiber distortion, distortions due to fiber non-linearities and crosstalk or cross-modulation of multiple signals in WDM systems. It should be noted that in these systems the distortion to be compensated is usually fairly low, such as −50 to −60 dBc relative to the signal level and the system noise floor is on a similar level because low-cost RF predistortion methods can readily achieve this performance. Only 10-20 dB of additional distortion reduction is desired. Because of this the required signal to quantization noise level of the DAC output is low and it can be expected that only 4-6 bits of data bus width are sufficient to achieve good performance. This modest requirement brings predistortion using FPGAs within reach, even in relatively low-cost systems that operate at GHz bandwidths. Secondly it should be noted that with the use of modest memory depth very complex distortion signals can be generated such as they occur when signals from different sources (or even one source) are mixed together with different delays.

FIG. 1 is an illustration of an embodiment of an FPGA-based optical transmitter with linearization. In this embodiment the RF signal is amplified and/or sampled by a high speed ADC 102. The samples are processed by an FPGA 104 which also adds predistortion signal components that are intended to compensate distortion generated by lasers, modulators 110 and other system elements in a fiberoptic link. The DAC 106 outputs to driver 106. The laser and/or modulator 110 output can be monitored locally by a detector, amplifier 114 and a second ADC 112. The FPGA 104 can use an algorithm to determine the distortion content of the feedback signal. That information can then be used by the FPGA 104 to adjust the predistortion signals. The fact that the FPGA 104 receives both input and feedback signals allows to make a distinction between distortion components in the feedback signal and components that were already present in the input signal. This configuration requires a high quality ADC 102 and DAC 106 because these may not affect the main signal that passes through them.

Figure 2:
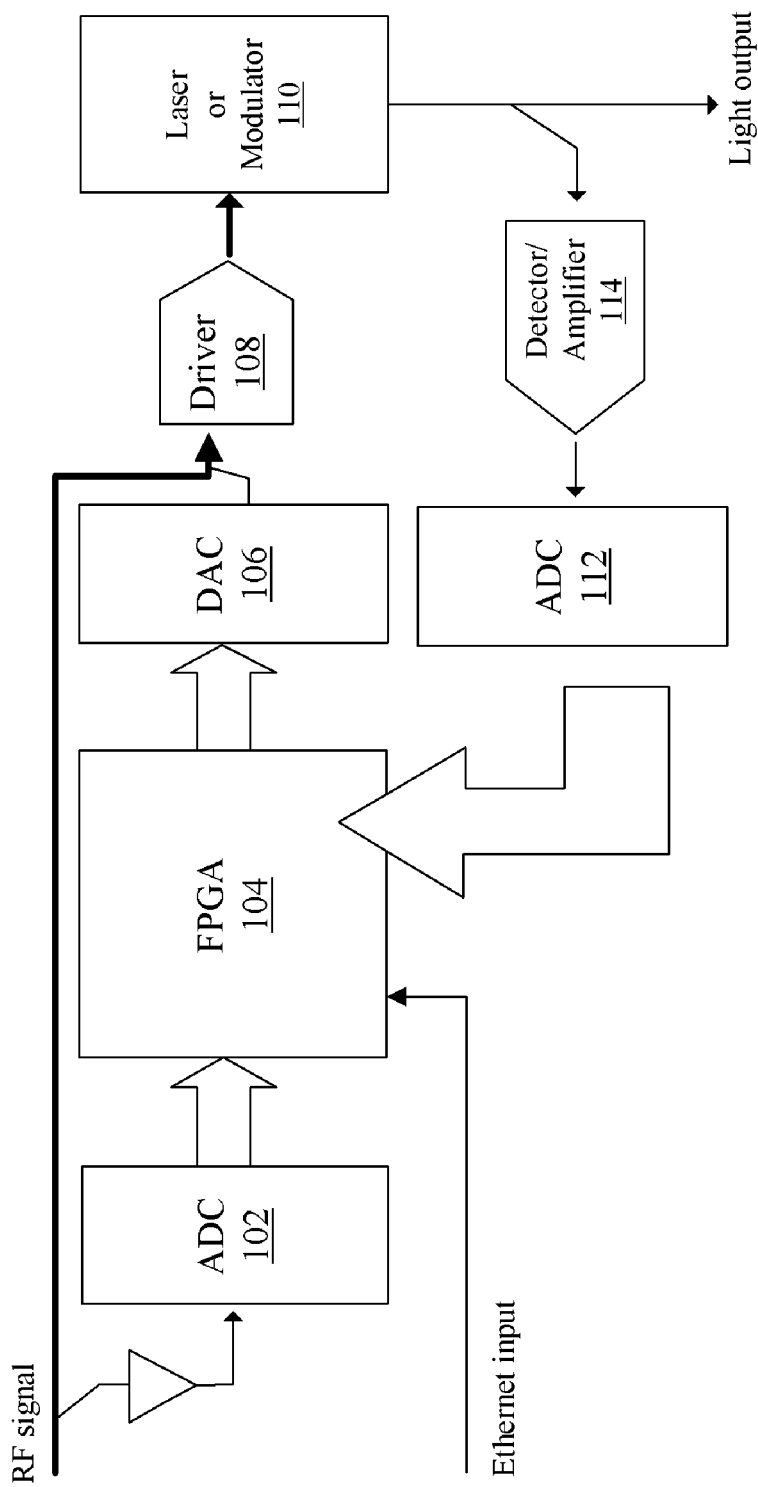
FIG. 2 is an illustration of an embodiment of an FPGA-based optical transmitter with linearization and an RF bypass.

FIG. 2 is an illustration of an embodiment of an FPGA-based optical transmitter with linearization and an RF bypass. The main RF signal bypasses the FPGA 104, and a split-off signal reaches the FPGA 104. The FPGA 104 generates predistortion components only that are provided to the DAC 106. The ADC 102 must be good enough to facilitate generation of the predistortion components but does not need to support the main signal itself. This allows for a lower cost ADC 102. Secondly an Ethernet input is shown on the FPGA 104. This digital input provides information that is transferred to a modulated signal by the FPGA 104 and then is provided to the DAC 106. Thus non-analog channels can be added to the transmitter output such as digital TV signals that are QAM modulated. The DAC 106 must be of sufficient quality to support these signals, but still does not need to support the full analog signal quality.

Figure 3:
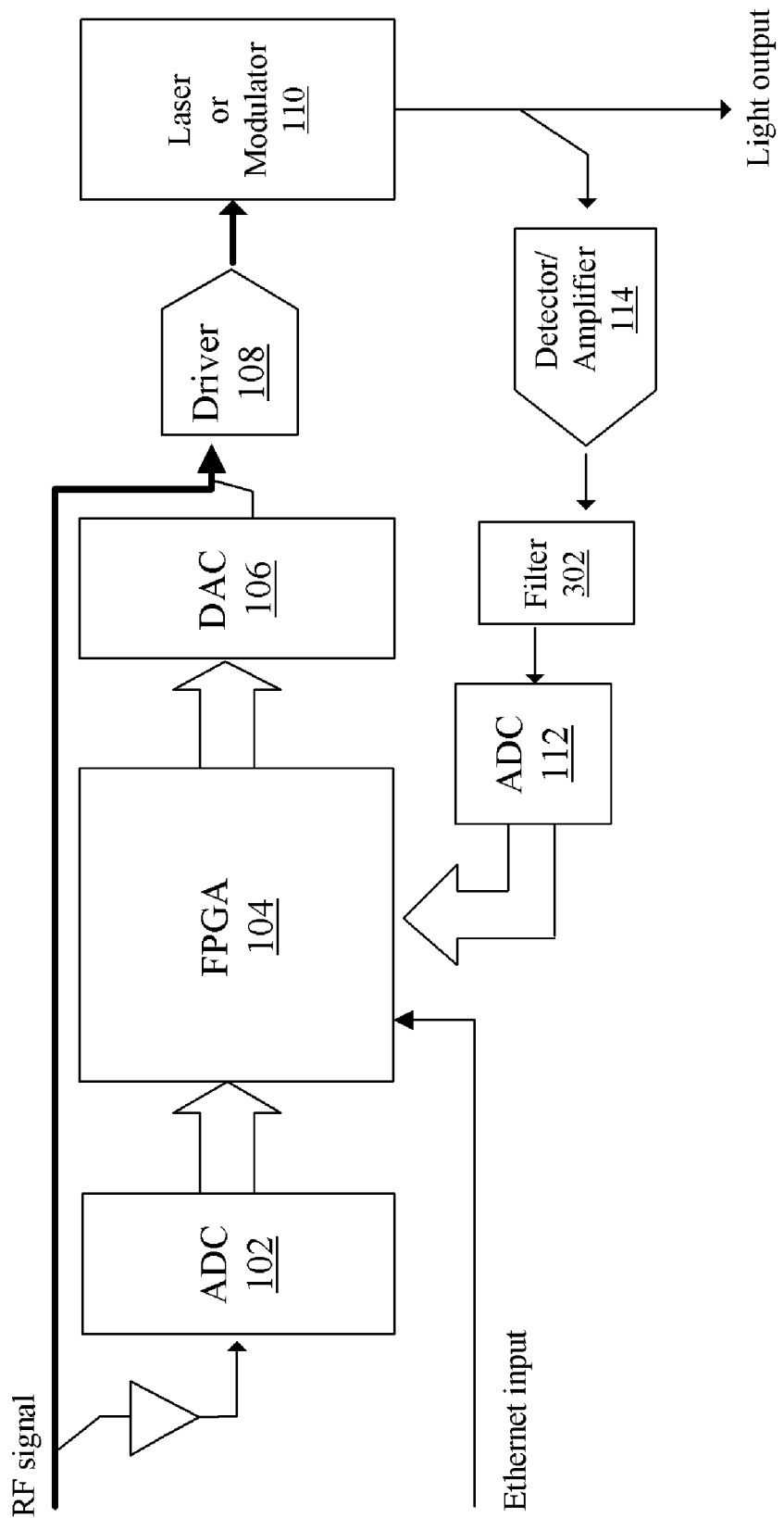
FIG. 3 is an illustration of an embodiment of an FPGA-based optical transmitter with linearization in which the high performance ADC in the feedback path is replaced by a low-cost ADC and the input to this ADC is filtered.

FIG. 3 is an illustration of an embodiment of an FPGA-based optical transmitter with linearization in which the high performance ADC 112 in the feedback path is replaced by a low-cost ADC 112 and the input to this ADC 112 is filtered. The filter 302 reduces the signal bandwidth into this ADC 112 such that a lower rate ADC 112 can be used to sample or sub-sample this signal. The FPGA 104 cannot anymore observe the full spectrum of distortions (unless the filter is tunable) but it can observe distortion bands selected by the filter 302. Because the distortions caused by the laser/modulator 110 and optical system only change slowly in time and also are well behaved as a function of frequency the predistortion algorithm can maintain good distortion cancellation by interpolating between distortion observations in time and at various frequencies.

Figure 4:
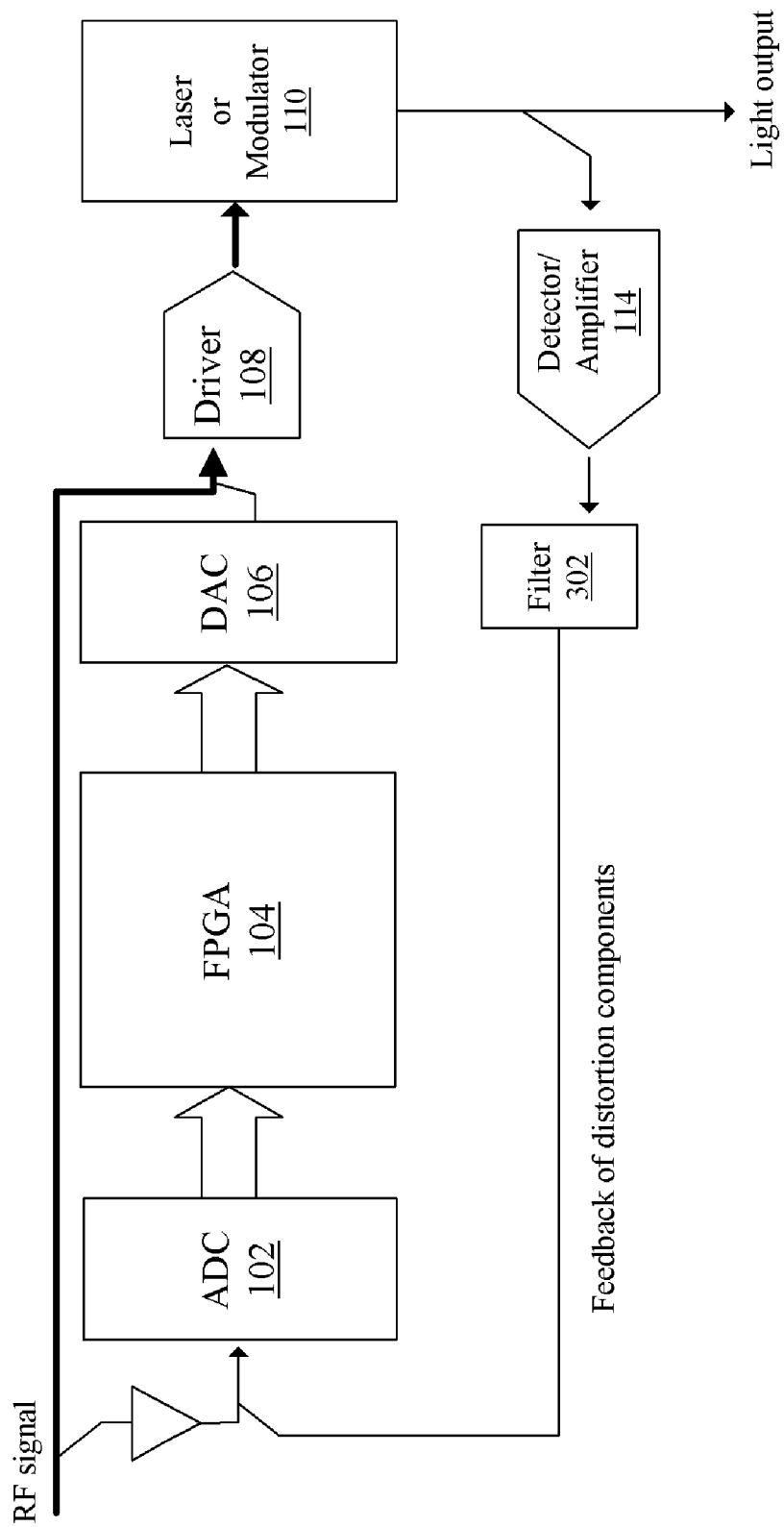
FIG. 4 is an illustration of an embodiment of an FPGA-based optical transmitter with linearization in which the low-speed ADC is eliminated.

FIG. 4 is an illustration of an embodiment of an FPGA-based optical transmitter with linearization in which the low-speed ADC 112 is eliminated. Distortions at specific frequencies are provided to the input ADC 102 in such a way that they do not interfere significantly with the function of sampling the input signal by that ADC 102. For instance, distortions out of the signal information band (above 1 GHz and below 50 MHz for a practical analog fiber optic transmitter) can be provided to the ADC 102. The predistortion algorithm can then cancel these distortions and implicitly cancel distortions at other frequencies by interpolation.

Figure 5:
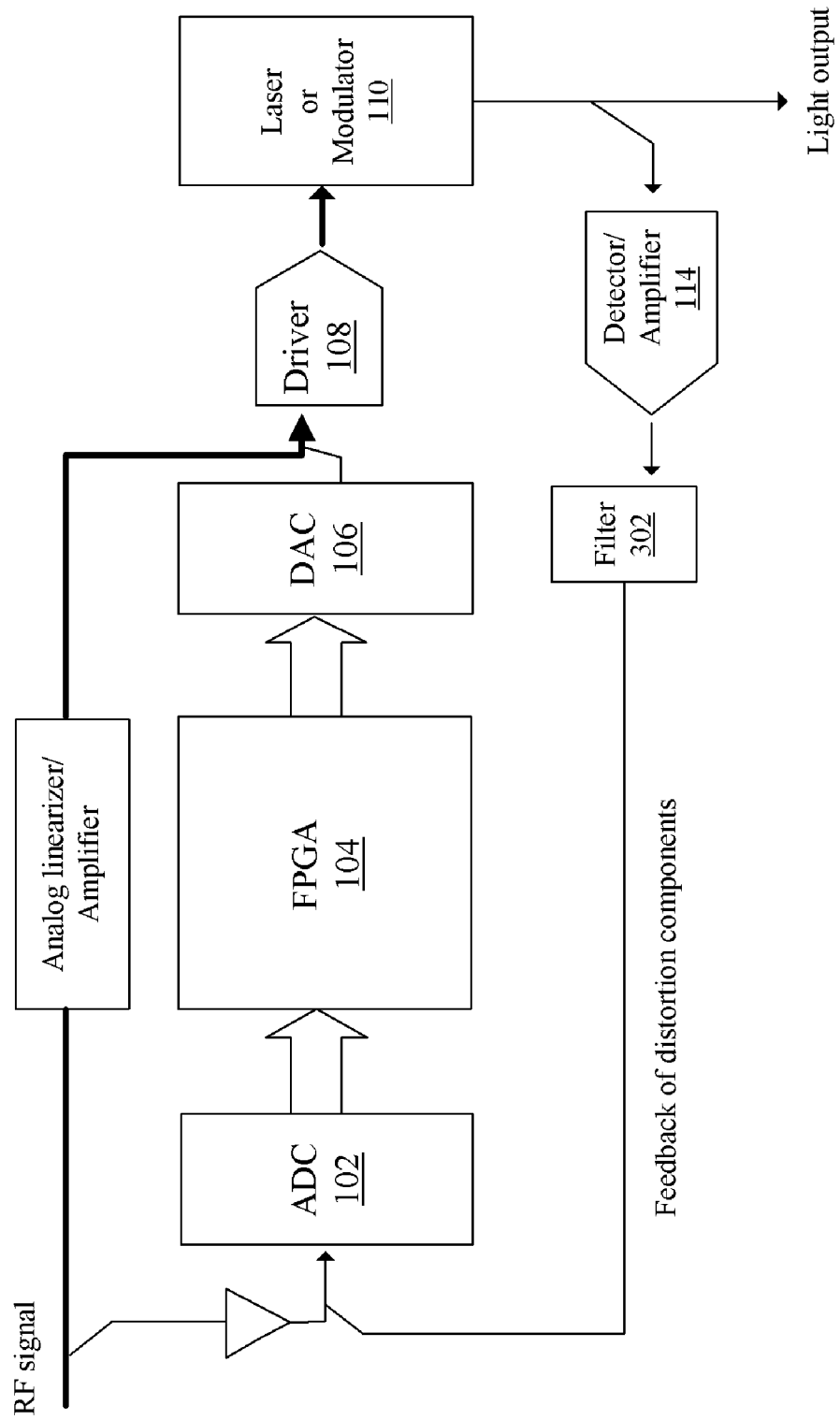
FIG. 5 is an illustration of an embodiment of an FPGA-based optical transmitter with linearization in which, for very large distortions, the transmitter may include an analog pre-distortion circuit in the main signal path (or in the driver for that matter) that significantly reduces the distortion.

FIG. 5 is an illustration of an embodiment of an FPGA-based optical transmitter with linearization in which, for very large distortions, the transmitter may include an analog predistortion circuit in the main signal path (or in the driver for that matter) that significantly reduces the distortion. This also reduces the amount of predistortion signal required from the DAC 106 and thus reduces requirements for DAC 106, FPGA 104 signal path bit width (and thus FPGA 104 size) and ADC 102.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. Predistortion logic for an optical communications laser or optical modulator, comprising:
   predistortion logic embodied in a field programmable gate array (FPGA);
   a first analog to digital converter (ADC) providing a representation of an RF signal at an input of the FPGA; and
   a digital to analog converter providing a representation of an output of the FPGA to the laser or modulator.

2. The predistortion logic of claim 1, further comprising:
   the RF signal also provided to the laser or modulator by bypassing the FPGA.

3. The predistortion logic of claim 1, further comprising:
   an Ethernet input to the FPGA.

4. The predistortion logic of claim 1, further comprising:
   a feedback path from the output of the laser or modulator to the input of the FPGA.

5. The predistortion logic of claim 4, further comprising:
   the feedback path comprising a second ADC.

6. The predistortion logic of claim 4, further comprising:
   the feedback path comprising a filter.

7. The predistortion logic of claim 1, further comprising:
   a feedback path from the output of the laser or modulator to the first ADC.

8. The predistortion logic of claim 7, further comprising:
   the feedback path comprising a filter.

9. The predistortion logic of claim 2, further comprising:
   the RF signal also provided to the laser or modulator by bypassing the FPGA via an analog linearizer.

10. A system comprising:
    an optical communications laser;
    predistortion logic embodied in a field programmable gate array (FPGA);
    a first analog to digital converter (ADC) providing a representation of an RF signal at an input of the FPGA; and
    a digital to analog converter providing a representation of an output of the FPGA to the laser.

11. The system of claim 10, further comprising:
    the RF signal also provided to the laser by bypassing the FPGA.

12. The system of claim 10, further comprising:
    an Ethernet input to the FPGA.

13. The system of claim 10, further comprising:
    a feedback path from the output of the laser to the input of the FPGA.

14. The system of claim 13, further comprising:
    the feedback path comprising a second ADC.

15. The system of claim 13, further comprising:
    the feedback path comprising a filter.

16. The system of claim 10, further comprising:
    a feedback path from the output of the laser to the first ADC.

17. The system of claim 16, further comprising:
    the feedback path comprising a filter.

18. The system of claim 11, further comprising:
    the RF signal also provided to the laser by bypassing the FPGA via an analog linearizer.

* * * * *